(12) United States Patent
Hattori et al.

(10) Patent No.: US 9,355,779 B2
(45) Date of Patent: May 31, 2016

(54) CERAMIC ELECTRONIC COMPONENT AND ELECTRONIC DEVICE

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 328 days.

(21) Appl. No.: 13/872,297

(22) Filed: Apr. 29, 2013

(65) Prior Publication Data
US 2013/0299224 A1 Nov. 14, 2013

(30) Foreign Application Priority Data

May 8, 2012 (JP) .................................. 2012-106819
Jan. 18, 2013 (JP) .................................. 2013-007110

(51) Int. Cl.
| H01G 4/228 | (2006.01) |
| H01G 4/30 | (2006.01) |
| H01G 4/232 | (2006.01) |
| H05K 3/34 | (2006.01) |
| H05K 1/18 | (2006.01) |
| H01G 4/12 | (2006.01) |
| H05K 1/02 | (2006.01) |
| H05K 1/11 | (2006.01) |

(52) U.S. Cl.
CPC ................. *H01G 4/30* (2013.01); *H01G 4/232* (2013.01); *H05K 3/3431* (2013.01); *H01G 4/12* (2013.01); *H05K 1/0271* (2013.01); *H05K 1/111* (2013.01); *H05K 1/181* (2013.01); *H05K 2201/09663* (2013.01); *H05K 2201/10015* (2013.01); *H05K 2201/10636* (2013.01); *H05K 2201/2045* (2013.01); *Y02P 70/611* (2015.11); *Y02P 70/613* (2015.11)

(58) Field of Classification Search
USPC .................................. 361/301.4, 306.1, 306.3
See application file for complete search history.

(56) References Cited

U.S. PATENT DOCUMENTS

| 5,880,925 A | 3/1999 | DuPre et al. |
| 6,995,967 B2 * | 2/2006 | Togashi et al. ................. 361/303 |
| 2007/0019365 A1 * | 1/2007 | Roy ........................ H01G 4/012 361/303 |
| 2007/0096254 A1 * | 5/2007 | Ritter et al. .................... 257/532 |
| 2008/0239624 A1 | 10/2008 | Togashi |
| 2010/0271752 A1 * | 10/2010 | Ishida et al. .................. 361/303 |

FOREIGN PATENT DOCUMENTS

| JP | 2002-508114 A | 3/2002 |
| JP | 2004-193352 A | 7/2004 |
| JP | 2009-027101 A | 2/2009 |
| JP | 2009-071106 A | 4/2009 |
| JP | 4577325 B2 | 11/2010 |

OTHER PUBLICATIONS

AVX, Low Inductance Capacitors Product Sheet, Jan. 4, 2010.*

* cited by examiner

*Primary Examiner* — Eric Thomas
(74) *Attorney, Agent, or Firm* — Keating & Bennett, LLP

(57) ABSTRACT

In an electronic component, a first outer electrode is provided on a first side surface and a second outer electrode is provided on a second side surface. Each of the first and second outer electrodes includes first and second electrode portions that are arranged at positions other than end portions and a center of the first or second side surface in a first direction.

19 Claims, 6 Drawing Sheets

CERAMIC ELECTRONIC COMPONENT AND ELECTRONIC DEVICE

BACKGROUND OF THE INVENTION

1. Field of the Invention

The present invention relates to ceramic electronic components and electronic devices including such electronic components.

2. Description of the Related Art

In the related art, ceramic electronic components, such as ceramic capacitors, are used in various electronic devices, for example, mobile communication terminals. For example, in a ceramic electronic component in which a pair of electrodes face each other with a dielectric ceramic layer disposed therebetween, the ceramic electronic component deforms when a voltage is applied due to distortion caused by a piezoelectric effect or an electrostrictive effect of the ceramic layer, namely, electric-field-induced distortion. When an AC voltage or a DC voltage with an AC component is applied on the ceramic electronic component, in some cases, a substrate on which this ceramic electronic component is mounted vibrates and generates sound due to the deformation of the ceramic electronic component. That phenomenon is referred to as acoustic noise.

The acoustic noise may cause discomfort for a user who uses an electronic device including such a ceramic electronic component. Thus, various techniques have been proposed to suppress the acoustic noise. One of the examples is described in Japanese Unexamined Patent Application Publication No. 2009-71106.

Recently, there have been more demands for further reduction of the acoustic noise.

SUMMARY OF THE INVENTION

Preferred embodiments of the present invention provide a ceramic electronic component that significantly reduces or prevents acoustic noise.

According to a preferred embodiment of the present invention, a ceramic electronic component includes a ceramic body, first and second inner electrodes, a first outer electrode, and a second outer electrode. The ceramic body includes first and second principal surfaces, first and second side surfaces, and third and fourth side surfaces. The first and second principal surfaces each extend in a first direction and a second direction that is perpendicular or substantially perpendicular to the first direction. The first and second side surfaces each extend in the first direction and a third direction that is perpendicular or substantially perpendicular to both the first direction and the second direction. The third and fourth side surfaces each extend in the second direction and the third direction. The first and second inner electrodes are provided inside the ceramic body parallel or substantially parallel to the first and second principal surfaces. The first and second inner electrodes face each other with a ceramic layer disposed therebetween in the third direction. The first outer electrode is provided on the first side surface. The first outer electrode is connected to the first inner electrode. The second outer electrode is provided on the second side surface. The second outer electrode is connected to the second inner electrode. The first inner electrode and the second inner electrode face each other with the ceramic layer disposed therebetween in the third direction at least at a central portion of the ceramic body when viewed along the third direction. Each of the first and second outer electrodes includes first and second electrode portions that are arranged on portions other than end portions and a center portion of the first or second side surface in the first direction.

In a ceramic electronic component according to another preferred embodiment of the present invention, a distance between the first electrode portion and the second electrode portion may preferably be less than a distance between the third side surface and the first electrode portion, and less than a distance between the fourth side surface and the second electrode portion.

In a ceramic electronic component according to another preferred embodiment of the present invention, preferably, the first electrode portion may be arranged so as to cover a region of the first or second side surface, and the region may preferably be, when viewed in the third direction, separated from the third side surface by a distance in a range from about L1/3 to about L1/4, for example, in the first direction where L1 is a length of the first or second side surface in the first direction. Preferably, the second electrode portion may be arranged so as to cover a region of the first or second side surface, and the region may be, when viewed in the third direction, separated from the fourth side surface by a distance in a range from about L1/3 to about L1/4, for example, in the first direction.

In a ceramic electronic component according to another preferred embodiment of the present invention, preferably a central portion of the first electrode portion in the first direction may be positioned within a region of the first or second side surface, and the region may be separated from the third side surface by a distance in a range from about L1/3 to about L1/4, for example, in the first direction. Preferably, a central portion of the second electrode portion in the first direction may be positioned within a region of the first or second side surface, and the region may be separated from the fourth side surface by a distance in a range from about L1/3 to about L1/4, for example, in the first direction.

In a ceramic electronic component according to another preferred of the present invention, the first and second electrode portions may preferably extend to on the first principal surface.

In a ceramic electronic component according to another preferred embodiment of the present invention, dimensions of the first and second side surfaces in the first direction may preferably be greater than dimensions of the third and fourth side surfaces in the second direction.

In a ceramic electronic component according to another preferred embodiment of the present invention, the ceramic body may preferably include ferroelectric ceramics, for example.

In a ceramic electronic component according to another preferred embodiment of the present invention, the ceramic body may preferably include barium titanate, for example.

According to another preferred embodiment of the present invention, an electronic device includes a ceramic electronic component according to a preferred embodiment of the present invention, a substrate, and solder. The ceramic electronic component is mounted on the substrate. The solder connects the substrate and the first and second electrode portions of respective first and second outer electrodes.

According to various preferred embodiments of the present invention, a ceramic electronic component is provided that significantly reduces or prevents acoustic noise.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
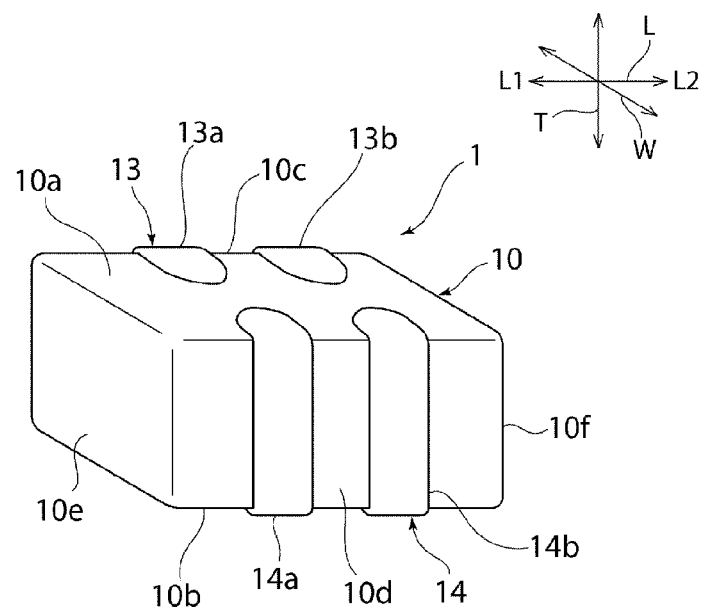
FIG. 1 is a schematic perspective view of a ceramic electronic component according to a preferred embodiment of the present invention.

Preferred embodiments of the present invention will be described below with reference to the drawings. The following preferred embodiments of the present invention are provided for illustrative purposes only, and the present invention is not limited thereto.

Furthermore, in the drawings, members having substantially the same functions are denoted by the same reference numerals. Furthermore, the drawings referred in the following preferred embodiments are schematic drawings. In some cases, dimensions and dimensional ratios of elements illustrated in the drawings may differ from those of actual elements. Furthermore, there may be differences in the dimensions and the dimensional ratios between the drawings. Dimensions and/or dimensional ratios shall be disclosed and determined in light of the following description.

Figure 2:
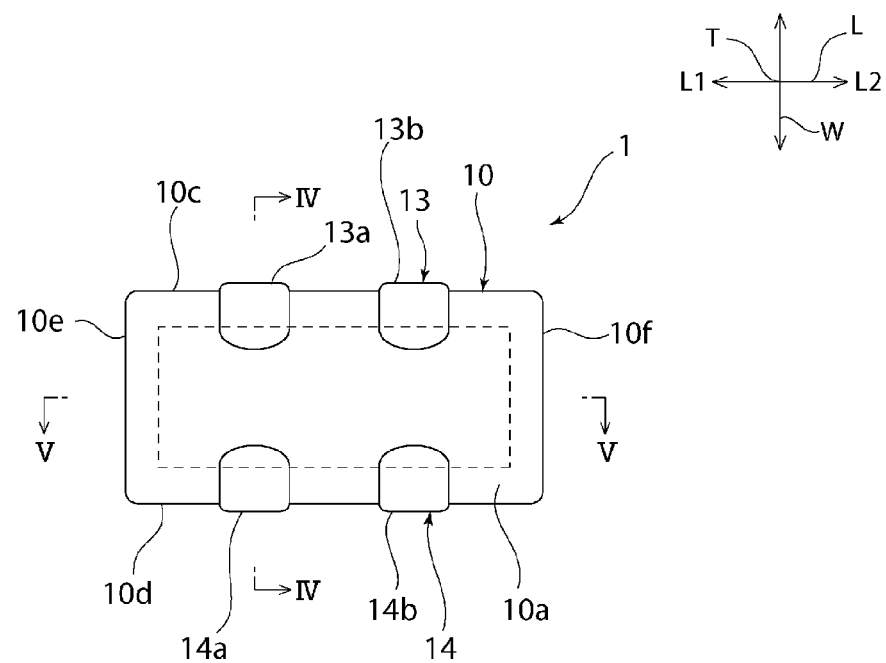
FIG. 2 is a schematic plan view of a ceramic electronic component according to a preferred embodiment of the present invention.
Figure 3:
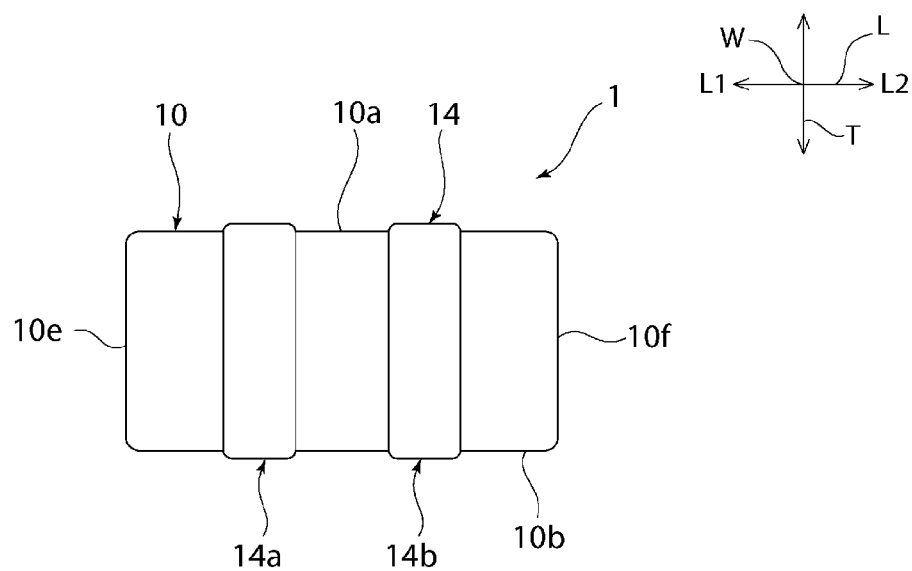
FIG. 3 is a schematic side view of a ceramic electronic component according to a preferred embodiment of the present invention.
Figure 4:
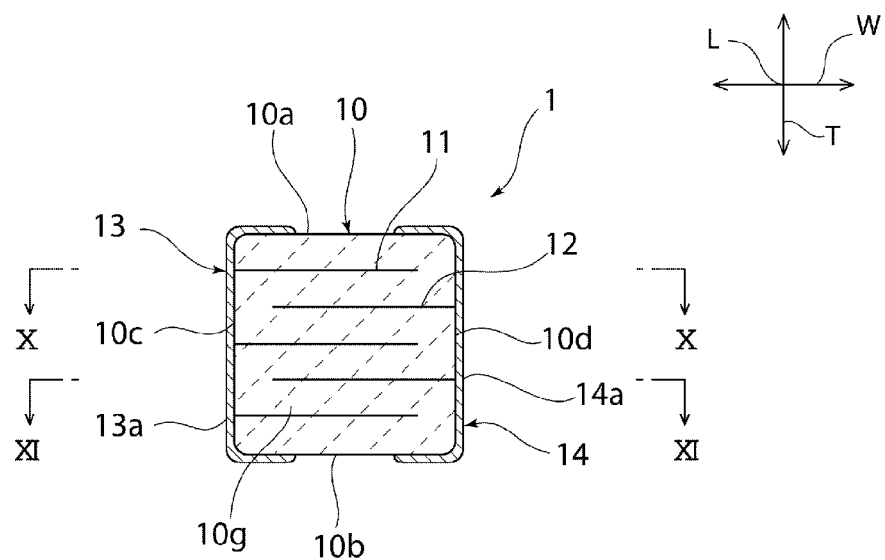
FIG. 4 is a schematic cross-sectional view taken along the IV-IV line in FIG. 2.
Figure 5:
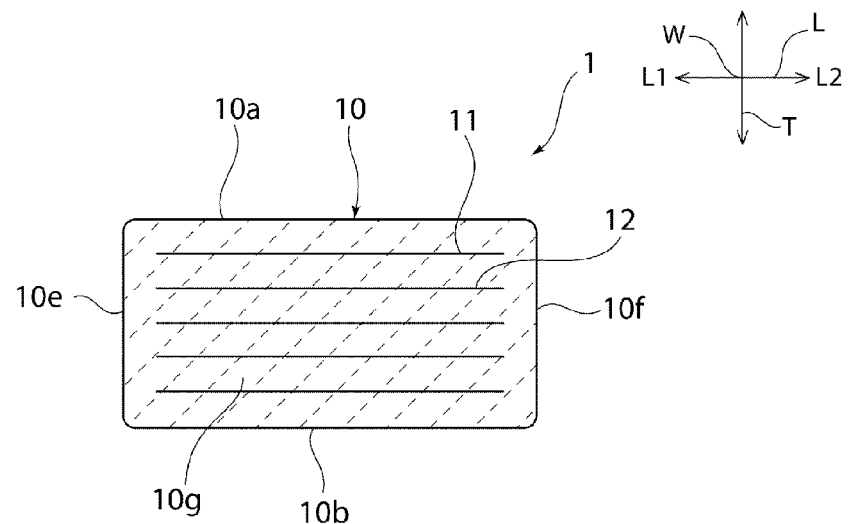
FIG. 5 is a schematic cross-sectional view taken along the V-V line in FIG. 2.
Figure 10:
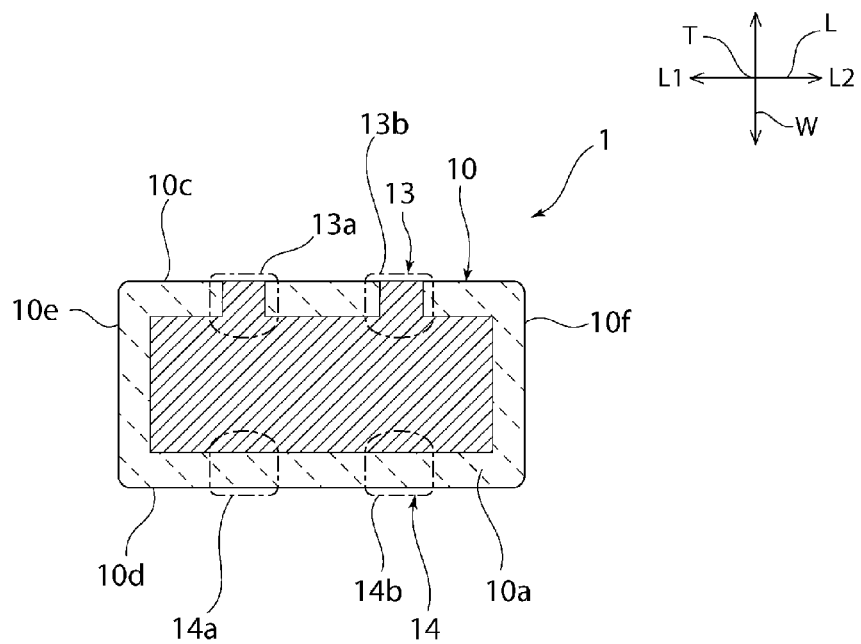
FIG. 10 is a schematic cross-sectional view taken along the X-X line in FIG. 4.
Figure 11:
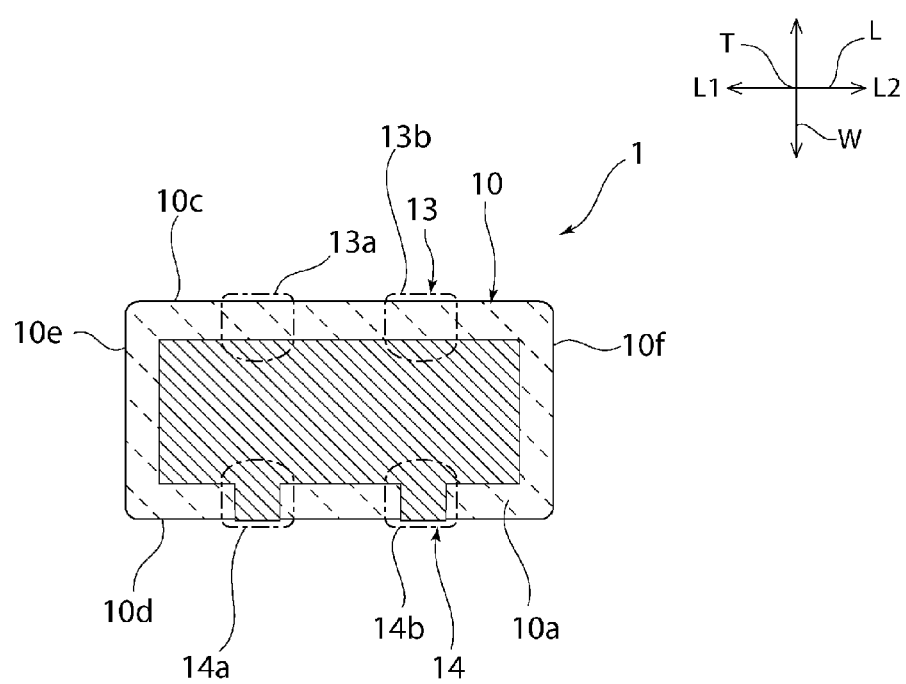
FIG. 11 is a schematic cross-sectional view taken along the XI-XI line in FIG. 4.

FIG. 1 is a schematic perspective view of a ceramic electronic component according to the present preferred embodiment. FIG. 2 is a schematic plan view of the ceramic electronic component according to the present preferred embodiment. FIG. 3 is a schematic side view of the ceramic electronic component according to the present preferred embodiment. FIG. 4 is a schematic cross-sectional view taken along the IV-IV line in FIG. 2. FIG. 5 is a schematic cross-sectional view taken along the V-V line in FIG. 2. FIG. 10 is a schematic cross-sectional view taken along the X-X line in FIG. 4. FIG. 11 is a schematic cross-sectional view taken along the XI-XI line in FIG. 4.

As illustrated in FIGS. 1 to 5, a ceramic electronic component 1 includes a ceramic body 10 including a dielectric ceramics material. The ceramic body 10 preferably has a rectangular or substantially rectangular parallelepiped shape. The ceramic body 10 includes principal surfaces 10a, 10b extending in a length direction L and a width direction W that is perpendicular or substantially perpendicular to the length direction L, side surfaces 10c, 10d (see FIG. 2) extending in the length direction L and a thickness direction T that is perpendicular or substantially perpendicular to both the length direction L and the width direction W, and side surfaces 10e, 10f (see FIG. 1) extending in the width direction W and the thickness direction T. In the present preferred embodiment, the length direction L is the first direction, the width direction W is the second direction, and the thickness direction T is the third direction.

Dimensions of the side surfaces 10c, 10d in the length direction L are greater than dimensions of the side surfaces 10e, 10f in the width direction W. Thus, areas of the side surfaces 10c, 10d are greater than those of the side surfaces 10e, 10f.

As illustrated in FIG. 4 and FIG. 5, first and second inner electrodes 11, 12 are provided inside the ceramic body 10. The first and second inner electrodes 11, 12 are each provided along the length direction L and the width direction W. In other words, the first and second inner electrodes 11, 12 are each arranged parallel or substantially parallel to the principal surfaces 10a, 10b. The first and second inner electrodes 11, 12 face each other with a ceramic layer 10g disposed therebetween in the thickness direction T.

The first inner electrode 11 is exposed to the side surface 10c. The first inner electrode 11 extends in the width direction W from the side surface 10c. The first inner electrode 11 is not exposed at either of the side surface 10d or the side surfaces 10e, 10f.

The second inner electrode 12 is exposed at the side surface 10d. The second inner electrode 12 extends in the width direction W from the side surface 10d. The second inner electrode 12 is not exposed at either of the side surface 10c or the side surfaces 10e, 10f.

A first outer electrode 13 is provided on the side surface 10c. The first outer electrode 13 is electrically connected to the first inner electrode 11. A second outer electrode 14 is provided on the side surface 10d. The second outer electrode 14 is electrically connected to the second inner electrode 12.

The ceramic electronic component 1 is preferably a single-element component including a pair of electrodes, i.e., the first and second outer electrodes 13, 14. All of the first inner electrodes 11 extend to each of first and second electrode portions 13a, 13b of the first outer electrode 13. All of the second inner electrodes 12 extend to each of first and second electrode portions 14a, 14b of the second outer electrode 14. The first inner electrode 11 and the second inner electrode 12 face each other at least at a central portion of the ceramic body 10 when viewed along the thickness direction T (in planar view), with the ceramic layer 10g disposed therebetween in the thickness direction T. More specifically, the first inner electrode 11 and the second inner electrode 12 face each other in the thickness direction T such that they face each other over an area that includes the central portion of the ceramic body 10 when viewed along the thickness direction T (in planar view) and covers substantially the entire central portion of the ceramic body 10 except a peripheral portion thereof.

When a voltage is applied between the first and second outer electrodes 13, 14, the electrostatic capacitance is generated in each dielectric ceramic layer sandwiched between the first inner electrode 11 and the second inner electrode 12, and in total the electrostatic capacitance is generated between the first and second outer electrodes 13, 14 so as to function as a capacitor.

The first and second inner electrodes 11, 12 and the first and second outer electrodes 13, 14 may each be made of any suitable electrically conductive material. More specifically, the first and second inner electrodes 11, 12 and the first and second outer electrodes 13, 14 may each preferably be made of at least one type of conductive material such as, but not limited to, Ni, Cu, Ag, Pd, Au, Pt, and Sn, for example.

The first outer electrode 13 includes the first electrode portion 13a and the second electrode portion 13b. The first electrode portion 13a and the second electrode portion 13b are arranged along the length direction L.

The first electrode portion 13a is, when viewed in the thickness direction T, arranged on a side closer to the side surface 10e (L1 side) than the center of the side surface 10c in the length direction L, but closer to the side surface 10f (L2 side) than the side surface 10e. In other words, a L2-side end portion of the first electrode portion 13a is positioned on a side closer to the side surface 10e (L1 side) than the center of the side surface 10c in the length direction L. A L1-side end portion of the first electrode portion 13a is positioned on a side closer to the side surface 10f (L2 side) than the side surface 10e, and does not extend to the side surface 10e.

It is preferable that the first electrode portion 13a is arranged on a portion of the side surface 10c, and that the portion is separated from the side surface 10e by a distance in the range from about L1/3 to about L1/4, for example, toward the side surface 10f in the length direction L where L1 is the length of the side surfaces 10c, 10d in the length direction L. It is further preferable that a center of the first electrode portion 13a in the length direction L is arranged so as to be positioned on a portion of the side surface 10c, and that the portion is separated from the side surface 10e by a distance in the range from about L1/3 to about L1/4, for example, toward the side surface 10f in the length direction L.

The second electrode portion 13b is, when viewed in the thickness direction T, arranged on a side closer to the side surface 10f (L2 side) than the center of the side surface 10c in the length direction L, but closer to the side surface 10e (L1 side) than the side surface 10f. In other words, a L1-side end portion of the second electrode portion 13b is positioned on a side closer to the side surface 10f (L2 side) than the center of the side surface 10c in the length direction L. A L2-side end portion of the second electrode portion 13b is positioned on a side closer to the side surface 10e (L1 side) than the side surface 10f and does not extend to the side surface 10f.

It is preferable that the second electrode portion 13b is arranged on a portion of the side surface 10c, and that the portion is separated from the side surface 10f by a distance in the range from about L1/3 to about L1/4, for example, toward the side surface 10e in the length direction L. It is further preferable that a center of the second electrode portion 13b in the length direction L is arranged so as to be positioned on a portion of the side surface 10c, and that the portion is separated from the side surface 10f by a distance in the range from about L1/3 to about L1/4, for example, toward the side surface 10e in the length direction L.

The first electrode portion 14a is, when viewed in the thickness direction T, arranged on a side closer to the side surface 10e (L1 side) than the center of the side surface 10d in the length direction L, but closer to the side surface 10f (L2 side) than the side surface 10e. In other words, a L2-side end portion of the first electrode portion 14a is positioned on a side closer to the side surface 10e (L1 side) than the center of the side surface 10d in the length direction L. A L1-side end portion of the first electrode portion 14a is positioned on a side closer to the side surface 10f (L2 side) than the side surface 10e and does not extend to the side surface 10e.

It is preferable that the first electrode portion 14a is arranged on a portion of the side surface 10d, and that the portion is separated from the side surface 10e by a distance in the range from about L1/3 to about L1/4, for example, toward the side surface 10f in the length direction L. It is further preferable that a center of the first electrode portion 14a in the length direction L is arranged so as to be positioned on a portion of the side surface 10d, and that the portion is separated from the side surface 10e by a distance in the range from about L1/3 to about L1/4, for example, toward the side surface 10f in the length direction L.

The second electrode portion 14b is, when viewed in the thickness direction T, arranged on a side closer to the side surface 10f (L2 side) than the center of the side surface 10d in the length direction L, but closer to the side surface 10e (L1 side) than the side surface 10f. In other words, a L1-side end portion of the second electrode portion 14b is positioned on a side closer to the side surface 10f (L2 side) than the center of the side surface 10d in the length direction L. A L2-side end portion of the second electrode portion 14b is positioned on a side closer to the side surface 10e (L1 side) than the side surface 10f, and does not extend to the side surface 10f.

It is preferable that the second electrode portion 14b is arranged on a portion of the side surface 10d, and that the portion is separated from the side surface 10f by a distance in the range from about L1/3 to about L1/4, for example, toward the side surface 10e in the length direction L. It is further preferable that a center of the second electrode portion 14b in the length direction L is arranged so as to be positioned on a portion of the side surface 10d, and that the portion is separated from the side surface 10f by a distance in the range from about L1/3 to about L1/4, for example, toward the side surface 10e in the length direction L.

The first and second electrode portions 13a, 13b, 14a, and 14b each extend from the side surface 10c or 10d to both of the first and second principal surfaces 10a and 10b. The first and second electrode portions 13a, 13b, 14a, and 14b each include a sub-portion disposed on the side surface 10c or 10d, a sub-portion disposed on the first principal surface 10a, and a sub-portion disposed on the second principal surface 10b. Thus, on each of the first and second principal surfaces 10a, 10b, four electrode portions 13a, 13b, 14a, and 14b are provided with some distances therebetween.

Figure 6:
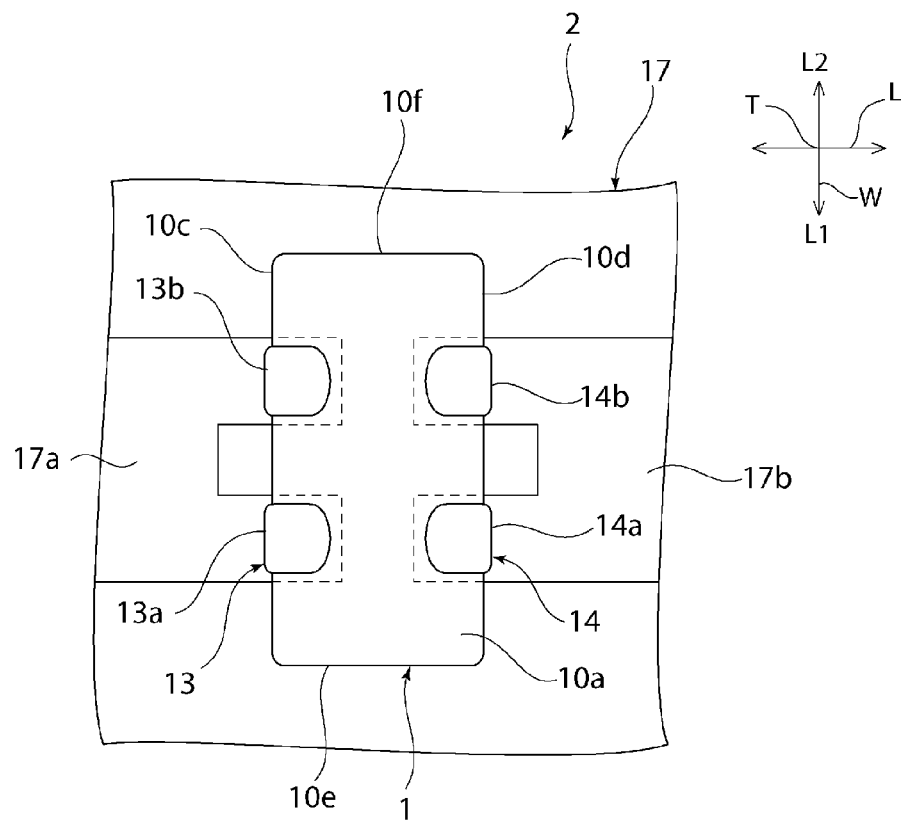
FIG. 6 is a schematic plan view of a portion of an electronic device according to a preferred embodiment of the present invention.
Figure 7:
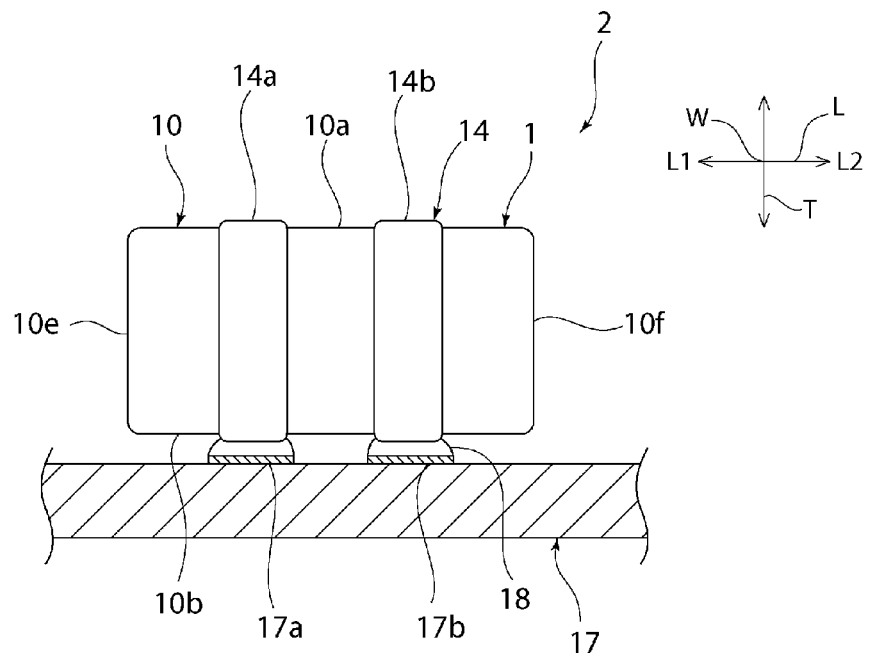
FIG. 7 is a schematic side view of a portion of an electronic device according to a preferred embodiment of the present invention.

FIG. 6 is a schematic plane view of a portion of an electronic device 2 including a ceramic electronic component 1. FIG. 7 is a schematic side view of a portion of the electronic device 2 including the ceramic electronic component 1.

The electronic device 2 includes a substrate 17 on which the ceramic electronic component 1 is mounted. The ceramic electronic component 1 and the substrate 17 are connected to one another with solder 18, for example. More specifically, the solder 18 is used to connect electrode pads 17a, 17b provided on the substrate 17 to the first and second electrode portions 13a, 13b, 14a, and 14b of the first and second outer electrodes 13, 14 of the ceramic electronic component 1. Thus, the ceramic electronic component 1 is mounted on the substrate 17 with a four-point support structure at portions in which the first and second electrode portions 13a, 13b, 14a, and 14b are provided.

In the ceramic electronic component 1, the electric-field-induced distortion occurs in the ceramic layer 10g when a voltage is applied between the first outer electrode 13 and the second outer electrode 14. In particular, the electric-field-induced distortion is greater when the ceramic layer includes ferroelectric, such as barium titanate, calcium titanate, or other suitable material, for example. Furthermore, the total electric-field-induced distortion becomes very large when the electrostatic capacitance between the first and second outer electrodes is equal to or greater than about 1 μF. Because of this electric-field-induced distortion, the ceramic body 10 deforms. More specifically, the side surfaces 10c, 10d and 10e, 10f of the ceramic body 10 are deformed and become concave whereas the principal surfaces 10a, 10b are deformed and become convex. In such a deformation of the ceramic body 10, there is no change in the volume of the ceramic body 10. Here, in the present preferred embodiment, the areas of the side surfaces 10e, 10f are less than those of the side surfaces 10c, 10d. Thus, amounts of distortion in the side surfaces 10e, 10f are greater than those of the side surfaces 10c, 10d. Accordingly, through the outer electrodes 13, 14 and the solder 18, the stress from the ceramic body 10 may be transmitted to a lesser extent to the substrate 17 when the outer electrodes 13, 14 are provided on the side surfaces 10c, 10d as in the present preferred embodiment as compared to a case in which the outer electrodes are provided on the side surfaces 10e, 10f. Thus, the acoustic noise of the substrate 17 is significantly reduced or prevented.

Figure 8:
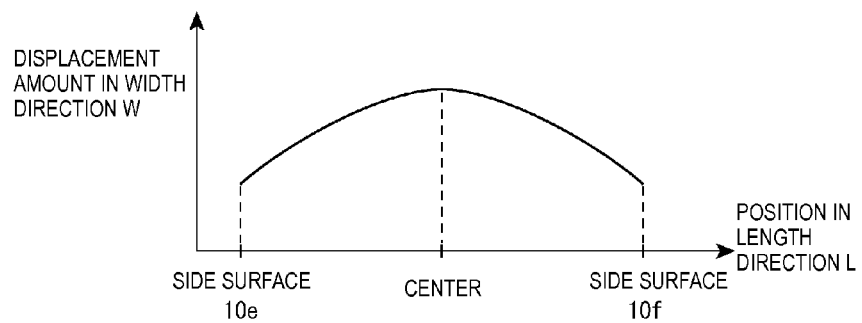
FIG. 8 is a graph illustrating a displacement amount of side surface in a width direction when a voltage is applied on a ceramic electronic component according to a preferred embodiment of the present invention.
Figure 9:
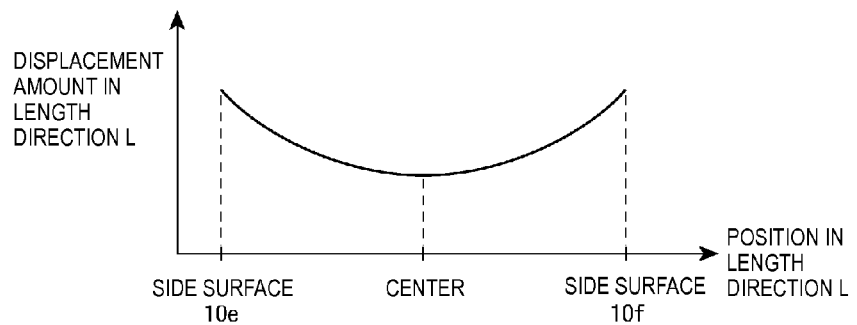
FIG. 9 is a graph illustrating a displacement amount of side surface in a length direction when a voltage is applied on a ceramic electronic component according to a preferred embodiment of the present invention.

FIG. 8 is a graph illustrating a displacement amount of the side surfaces 10c, 10d in the width direction W when a voltage is applied on the ceramic electronic component 1. FIG. 9 is a graph illustrating a displacement amount of the side surfaces 10c, 10d in the length direction L when a voltage is applied on the ceramic electronic component 1. The displacement amounts illustrated in FIG. 8 and FIG. 9 are displacement amounts at center portions of the side surfaces 10c, 10d of the ceramic body 10 in the thickness direction T.

As illustrated in FIG. 8, at the time of applying voltage, the displacement amount of the side surfaces 10c, 10d in the width direction W reaches a maximum at a center portion and a minimum at both end portions in the length direction L. On the other hand, as illustrated in FIG. 9, at the time of applying voltage, the displacement amount of the side surfaces 10c, 10d in the length direction L reaches a minimum at the center portion and maxima at the both end portions in the length direction L. Thus, the first electrode portions 13a, 14a are, when viewed in the thickness direction T, arranged on sides closer to the side surface 10e (L1 side) than the corresponding centers of the side surfaces 10c, 10d in the length direction L, but closer to the side surface 10f (L2 side) than the side surface 10e. Furthermore, the second electrode portions 13b, 14b are, when viewed in the thickness direction T, arranged on sides closer to the side surface 10f (L2 side) than the corresponding centers of the side surfaces 10c, 10d in the length direction L, but closer to the side surface 10e (L1 side) than the side surface 10f. In addition, the first and second electrode portions 13a, 14a, 13b, and 14b are preferably arranged so as to avoid positions at which their displacement amounts reach the maximum so as to reduce the transmission of the displacements to the substrate and making it possible to effectively reduce or prevent the acoustic noise. In other words, the acoustic noise may be effectively reduced or prevented by providing the first outer electrode 13 only from the first electrode portions 13a and 13b provided on the first side surface 10c at positions other than the end portions and the center thereof in the length direction L and the second outer electrode 14 only from the second electrode portions 14a and 14b provided on the second side surface 10d at positions other than the end portions and the center thereof in the length direction L.

Furthermore, to effectively reduce the acoustic noise, it is preferable that distances between the first electrode portions 13a, 14a and the second electrode portions 13b, 14b are less than distances between the third side surface 10e and the first electrode portions 13a, 14a, and less than distances between the fourth side surface 10f and the second electrode portions 13b, 14b. In this arrangement, a distance between attachment points of the ceramic electronic component, which provide transmission paths of vibration, is reduced, thus making it possible to significantly reduce or prevent the vibration of substrate. As a result, the acoustic noise may be effectively reduced or prevented.

Furthermore, it is preferable that the first electrode portions 13a and 14a cover regions of the first side surface 10c and the second side surface 10d, respectively. The regions are, when viewed in the thickness direction T, preferably separated from the third side surface 10e by a distance in the range from about L1/3 to about L1/4, for example, in the length direction L. It is preferable that the second electrode portions 13b and 14b cover regions of the first side surface 10c and the second side surface 10d, respectively. The regions are, when viewed in the thickness direction T, preferably separated from the fourth side surface 10f by a distance in the range from about L1/3 to about L1/4, for example, in the length direction L. In this arrangement, the ceramic electronic component is fixed in a wide area of a region in which the displacement amount is relatively small, making it possible to significantly reduce or prevent the vibration to be transmitted to the substrate. As a result, the acoustic noise is effectively reduced or prevented.

Furthermore, it is preferable that the centers of the first electrode portions 13a and 14a in the length direction L are positioned within regions of the first side surface 10c and the second side surface 10d, respectively, and the regions are preferably separated from the third side surface 10e by a distance in the range from about L1/3 to about L1/4, for example, in the length direction L. It is preferable that the centers of the second electrode portions 13b and 14b in the length direction L are positioned within regions of the first side surface 10c and the second side surface 10d, respectively, and the regions are preferably separated from the fourth side surface 10f by a distance in the range from about L1/3 to about L1/4, for example, in the length direction L. In this arrangement, the ceramic electronic component is attached such that attachment center points are positioned within the regions in which the displacement amount is relatively small, making it possible to significantly reduce or prevent the vibration to be transmitted to the substrate. As a result, the acoustic noise is effectively reduced or prevented.

It is preferable that the first electrode portions 13a and 14a are arranged on portions of the side surfaces 10c and 10d, respectively, and the portions are preferably separated from the side surface 10e by a distance of about L1/3, for example, toward the side surface 10f in the length direction L. It is preferable that the second electrode portions 13b and 14b are arranged on portions of the side surfaces 10c and 10d, respectively, and the portions are separated from the side surface 10f by a distance of about L1/3, for example, toward the side surface 10e in the length direction L.

To further effectively reduce the acoustic noise, it is further preferable that the centers of the first electrode portions 13a and 14a in the length direction L are arranged so as to be positioned on portions of the side surfaces 10c and 10d, respectively, and the portions are preferably separated from the side surface 10e by a distance of about L1/3, for example, toward the side surface 10f in the length direction L. It is further preferable that the centers of the second electrode portions 13b and 14b in the length direction L are arranged so as to be positioned on portions of the side surfaces 10c and 10d, respectively, and the portions are preferably separated from the side surface 10f by a distance of about L1/3, for example, toward the side surface 10e in the length direction L.

Furthermore, each of the first and second electrode portions 13a, 13b, 14a, and 14b of the first and second outer electrodes 13 and 14 includes a sub-portion provided on the principal surface 10a and a sub-portion provided on the principal surface 10b. Thus, each sub-portion of the first and second electrode portions 13a, 13b, 14a, and 14b positioned on the principal surface 10a or the principal surface 10b functions as a supporting portion when mounting the ceramic electronic component 1 on the substrate 17. Thus, the ceramic electronic component 1 is supported at four points. Accordingly, the ceramic electronic component 1 may be easily mounted on the substrate 17 with a suitable orientation.

The present preferred embodiment is described with reference to an example in which the outer electrodes 13, 14 are provided on the side surfaces 10c, 10d. Alternatively, the outer electrodes 13, 14 may be provided on the side surfaces 10e, 10f.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
a ceramic body including first and second principal surfaces each extending in a first direction and a second direction that is perpendicular or substantially perpendicular to the first direction, first and second side surfaces each extending in the first direction and a third direction that is perpendicular or substantially perpendicular to both the first direction and the second direction, and third and fourth side surfaces each extending in the second direction and the third direction;
first and second inner electrodes provided inside the ceramic body parallel or substantially parallel to the first and second principal surfaces, the first and second inner electrodes facing each other with a ceramic layer disposed therebetween in the third direction;
a first outer electrode provided on the first side surface and connected to the first inner electrode; and
a second outer electrode provided on the second side surface and connected to the second inner electrode;
wherein
the first inner electrode and the second inner electrode face each other with the ceramic layer disposed therebetween in the third direction at least at a center of the ceramic body when viewed along the third direction;
each of the first and second outer electrodes includes first and second electrode portions that are separated and spaced apart from each other along the respective first or second side surface in the first direction and at positions other than end portions and a center portion of the respective first or second side surface in the first direction;
the first and second electrode portions of the first outer electrode are connected to the first inner electrode;
the first and second electrode portions of the second outer electrode are connected to the second inner electrode;
the first inner electrode extends to the first side surface but does not extend to the second side surface;
the second inner electrode extends to the second side surface but does not extend to the first side surface;
the first electrode portion is arranged so as to cover a region of the first or second side surface, the region being, when viewed in the third direction, separated from the third side surface by a distance in a range from about L1/3 to about L1/4 in the first direction, where L1 is a length of the first or second side surface in the first direction; and
the second electrode portion is arranged so as to cover a region of the first or second side surface, the region being, when viewed in the third direction, separated from the fourth side surface by a distance in a range from about L1/3 to about L1/4 in the first direction.

2. The ceramic electronic component according to claim 1, wherein
a distance between the first electrode portion and the second electrode portion of the first outer electrode arranged next to each other on the first side surface is less than a distance between the third side surface and the first electrode portion of the first outer electrode, and less than a distance between the fourth side surface and the second electrode portion of the first outer electrode; and
a distance between the first electrode portion and the second electrode portion of the second outer electrode arranged next to each other on the second side surface is less than a distance between the third side surface and the first electrode portion of the second outer electrode, and less than a distance between the fourth side surface and the second electrode portion of the second outer electrode.

3. The ceramic electronic component according to claim 1, wherein the first and second electrode portions each extend onto the first principal surface.

4. The ceramic electronic component according to claim 1, wherein dimensions of the first and second side surfaces in the first direction are greater than dimensions of the third and fourth side surfaces in the second direction.

5. The ceramic electronic component according to claim 1, wherein the ceramic body includes ferroelectric ceramics.

6. The ceramic electronic component according to claim 1, wherein the ceramic body includes barium titanate.

7. The ceramic electronic component according to claim 1, wherein the first and second electrode portions each extend onto the second principal surface.

8. The ceramic electronic component according to claim 1, wherein
the first inner electrode extends to the first side surface and does not extend to any of the second, third, and fourth side surfaces; and
the second inner electrode extends to the second side surface and does not extend to any of the first, third, and fourth side surfaces.

9. The ceramic electronic component according to claim 1, wherein the first and second outer electrodes are made of at least one of Ni, Cu, Ag, Pd, Au, Pt, and Sn.

10. The ceramic electronic component according to claim 1, wherein the first and second inner electrodes are made of at least one of Ni, Cu, Ag, Pd, Au, Pt, and Sn.

11. The ceramic electronic component according to claim 1, wherein the first and second electrode portions each extend onto the first principal surface and onto the second principal surface.

12. An electronic device comprising:
a ceramic electronic component according to claim 1;
a substrate on which the ceramic electronic component is mounted; and
solder that connects the substrate and the first and second electrode portions of respective first and second outer electrodes of the ceramic electronic component.

13. The electronic device according to claim 12, wherein
the first and second electrode portions each include a portion extending onto the first principal surface;
the solder connects the portion of each of the first and second electrode portions extending onto the first principal surface to the substrate.

14. The electronic device according to claim 12, wherein
the substrate includes electrode pads arranged to correspond to the first and second electrode portions of the first and second outer electrodes; and
the solder is disposed between respective pairs of the electrode pads and the first and second electrode portions.

15. The electronic device according to claim 12, wherein the solder connects the substrate and the first and second electrode portions of respective first and second outer electrodes of the ceramic electronic component at four separate and distinct locations.

16. The ceramic electronic component according to claim 1, wherein
the first outer electrode consists of the first and second electrode portions; and
the second outer electrode consists of the first and second electrode portions.

17. The ceramic electronic component according to claim 16, wherein
a distance between the first electrode portion and the second electrode portion of the first outer electrode is less than a distance between the third side surface and the first electrode portion of the first outer electrode, and less than a distance between the fourth side surface and the second electrode portion of the first outer electrode; and
a distance between the first electrode portion and the second electrode portion of the second outer electrode is less than a distance between the third side surface and the first electrode portion of the second outer electrode, and less than a distance between the fourth side surface and the second electrode portion of the second outer electrode.

18. A ceramic electronic component comprising:
a ceramic body including first and second principal surfaces each extending in a first direction and a second direction that is perpendicular or substantially perpendicular to the first direction, first and second side surfaces each extending in the first direction and a third direction that is perpendicular or substantially perpendicular to both the first direction and the second direction, and third and fourth side surfaces each extending in the second direction and the third direction;
first and second inner electrodes provided inside the ceramic body parallel or substantially parallel to the first and second principal surfaces, the first and second inner electrodes facing each other with a ceramic layer disposed therebetween in the third direction;
a first outer electrode provided on the first side surface and connected to the first inner electrode; and
a second outer electrode provided on the second side surface and connected to the second inner electrode; wherein
the first inner electrode and the second inner electrode face each other with the ceramic layer disposed therebetween in the third direction at least at a center of the ceramic body when viewed along the third direction;
each of the first and second outer electrodes includes first and second electrode portions that are separated and spaced apart from each other along the respective first or second side surface in the first direction and at positions other than end portions and a center portion of the respective first or second side surface in the first direction;
the first and second electrode portions of the first outer electrode are connected to the first inner electrode;
the first and second electrode portions of the second outer electrode are connected to the second inner electrode;
the first inner electrode extends to the first side surface but does not extend to the second side surface;
the second inner electrode extends to the second side surface but does not extend to the first side surface;
a center of the first electrode portion in the first direction is positioned within a region of the first or second side surface, the region being separated from the third side surface by a distance in a range from about $L1/3$ to about $L1/4$ in the first direction, where $L1$ is a length of the first or second side surface in the first direction; and
a center of the second electrode portion in the first direction is positioned within a region of the first or second side surface, the region being separated from the fourth side surface by a distance in a range from about $L1/3$ to about $L1/4$ in the first direction.

19. A ceramic electronic component comprising:
a ceramic body including first and second principal surfaces each extending in a first direction and a second direction that is perpendicular or substantially perpendicular to the first direction, first and second side surfaces each extending in the first direction and a third direction that is perpendicular or substantially perpendicular to both the first direction and the second direction, and third and fourth side surfaces each extending in the second direction and the third direction;
first and second inner electrodes provided inside the ceramic body parallel or substantially parallel to the first and second principal surfaces, the first and second inner electrodes facing each other with a ceramic layer disposed therebetween in the third direction;
a first outer electrode provided on the first side surface and connected to the first inner electrode; and
a second outer electrode provided on the second side surface and connected to the second inner electrode; wherein
the first inner electrode and the second inner electrode face each other with the ceramic layer disposed therebetween in the third direction at least at a center of the ceramic body when viewed along the third direction;
each of the first and second outer electrodes includes first and second electrode portions that are separated and spaced apart from each other along the respective first or second side surface in the first direction and at positions other than end portions and a center portion of the respective first or second side surface in the first direction;
the first and second electrode portions of the first outer electrode are connected to the first inner electrode;
the first and second electrode portions of the second outer electrode are connected to the second inner electrode;
the first inner electrode extends to the first side surface but does not extend to the second side surface;
the second inner electrode extends to the second side surface but does not extend to the first side surface;
a distance between the first electrode portion and the second electrode portion of the first outer electrode arranged next to each other on the first side surface is less than a distance between the third side surface and a portion of the first outer electrode nearest to the third side surface, and less than a distance between the fourth side surface and a portion of the first outer electrode nearest to the fourth side surface; and a distance between the first electrode portion and the second electrode portion of the second outer electrode arranged next to each other on the second side surface is less than a distance between the third side surface and a portion of the second outer electrode nearest to the third side surface, and less than a distance between the fourth side surface and a portion of the second outer electrode nearest to the fourth side surface.

* * * * *